United States Patent [19]

Patrick et al.

[11] Patent Number: 5,451,875
[45] Date of Patent: Sep. 19, 1995

[54] TECHNIQUE FOR REDUCING ALIASING ARTIFACTS WTIH INSERTABLE GRADIENT COILS

[75] Inventors: John L. Patrick, Chagrin Falls; David A. Lampman, Lakewood, both of Ohio

[73] Assignee: Picker International, Inc., Highland Hts., Ohio

[21] Appl. No.: 116,076

[22] Filed: Sep. 2, 1993

Related U.S. Application Data

[63] Continuation-in-part of Ser. No. 30,601, Mar. 11, 1993, Pat. No. 5,278,504, which is a continuation of Ser. No. 805,016, Dec. 11, 1991, abandoned, which is a continuation-in-part of Ser. No. 719,334, Jun. 21, 1991, Pat. No. 5,177,441, which is a continuation-in-part of Ser. No. 368,047, Jun. 16, 1989, Pat. No. 5,036,282.

[51] Int. Cl.⁶ ............................................. G01R 33/28
[52] U.S. Cl. ..................................... 324/318; 324/322
[58] Field of Search ............... 324/300, 307, 309, 318, 324/319, 320, 322; 128/653.5

[56] References Cited

U.S. PATENT DOCUMENTS

| | | | |
|---|---|---|---|
| 4,961,054 | 10/1990 | Park et al. | 324/322 |
| 5,235,279 | 8/1993 | Kaufman et al. | 324/309 |
| 5,278,504 | 1/1994 | Patrick et al. | 324/318 |
| 5,280,248 | 1/1994 | Zoa et al. | 324/318 |
| 5,394,086 | 2/1995 | Patrick et al. | 324/322 |

Primary Examiner—Sandra L. O'Shea
Assistant Examiner—Raymond Y. Mah
Attorney, Agent, or Firm—Fay, Sharpe, Beall, Fagan, Minnich & McKee

[57] ABSTRACT

A magnet assembly (10) generates a temporally constant magnetic field through a central bore (12). A whole body gradient coil assembly (30) and a whole body radio frequency coil (36) are mounted in the central bore. A insertable gradient coil assembly (40), such as a head gradient coil, is selectively insertable into and removable from the bore (12). The insertable gradient coil assembly generates linear magnetic field gradients (90) within its bore for encoding magnetic resonance excited and manipulated by radio frequency signals from the whole body radio frequency coil. In regions (96) outside of the insertable gradient coil, the insertable gradient coil produces magnetic field gradients of the same strength as magnetic field gradients generated within its bore. Resonating dipoles within regions (96) contribute encoded magnetic resonance signals which are indistinguishable from the encoded magnetic resonance signals generated from within the insertable gradient coil bore. The whole body gradient coil assembly (30) generates magnetic field gradient pulses concurrently with RF pulses from the whole body gradient coil (36) to saturate material in the aliasing regions (96) or selected aliasing region portions (100) within which there are dipoles that contribute aliasing resonance signal components.

11 Claims, 4 Drawing Sheets

TECHNIQUE FOR REDUCING ALIASING ARTIFACTS WTIH INSERTABLE GRADIENT COILS

The present invention is a continuation-in-part of U.S. patent application Ser. No. 08/030,601, filed Mar. 11, 1993, now U.S. Pat. No. 5,278,504, which, in turn, is a continuation of U.S. patent application Ser. No. 07/805,016, filed Dec. 11, 1991, now abandoned, which is a continuation-in-part of U.S. patent application Ser. No. 07/719,334, filed Jun. 21, 1991, now U.S. Pat. No. 5,177,441, which is a continuation-in-part of U.S. patent application Ser. No. 07/368,047, filed Jun. 16, 1989, now U.S. Pat. No. 5,036,282.

BACKGROUND OF THE INVENTION

The present application pertains to the magnetic resonance arts. It finds particular application in conjunction with magnetic resonance imaging with insertable gradient coils and will be described with particular reference thereto. It is to be appreciated that the invention will also find application in spectroscopy and other processes and apparatus in which accurate and predictable magnetic field gradient and resonance responses are sought.

Commonly, magnetic resonance imaging systems have a built-in, whole body gradient coil surrounding the patient receiving bores. For maximum efficiency, it would be advantageous to use gradient coils of the minimum diameter or size which will accept the portion of the subject to be imaged while maintaining gradient linearity. Because energy for the gradient field varies roughly with a fifth power of diameter in free space, reducing gradient coil size has a dramatic beneficial effect on power consumption. The larger diameter coils further have larger inductances which slow the switching speed of the gradient magnetic fields.

To achieve these advantages and others when imaging smaller regions of the patient, insertable gradient coils are often inserted into the bore of the magnetic resonance imaging system. These insertable coils include head coils, surface coils, biplanar gradient coils, and other special purpose gradient coils that are receivable in the main bore of the magnet assembly.

During an imaging sequence, a series of radio frequency pulses are applied in coordination with magnetic field gradients. The radio frequency pulses are typically applied by a whole body radio frequency coil which also surrounds the main magnet bore into which the insertable gradient coil has been inserted. The inserted gradient coil applies gradient magnetic field pulses for phase encoding, frequency encoding, slice selection, and the like of a limited region of the subject within its smaller bore. The magnetic resonance signals emanating from the region within the inserted gradient field coil are received, typically using a dedicated local RF coil, and processed to generate image representations.

The examined subject extends beyond the inserted gradient coil into regions of the main bore to which the whole body RF coil and, to a lesser extent, the local RF coil are sensitive. One problem with insertable gradient coils is that they generate magnetic fields which extend beyond the bore. In particular, the generated magnetic field gradients are linear through a target region in the insertable gradient coil bore reaching a maximum at a roll-off point near the edge of the insertable gradient coil. Past the roll-off point, the gradient field strength approaches zero with distance from the insertable gradient field coil. Thus, portions of the subject within the sensitive field of the whole body RF coil and to a lesser extent the local RF coil but outside of the inserted gradient coil are subject to gradients of the same strength as portions of the patient within the inserted gradient coil. Signals produced in regions with the same strength gradient magnetic field are indistinguishable by conventional magnetic resonance equipment and reconstruction algorithms. Hence, there is confusion of signals from the external regions with those from the target region within the inserted gradient coil. This confusion results in an alias image of material outside of the insertable gradient coil superimposed on the desired image from the target region within the inserted gradient coil.

one technique for overcoming this problem is to design the gradient coil such that its roll-over points extend past the limits of the target subject, or at least far enough away from the local RF receiver coils that the signals from these regions will not be strongly coupled to the RF coil. Unfortunately, extending the gradient coil roll-over points or limiting the length or extent of the RF coil each have significant performance costs for a magnetic resonance imaging system.

Another technique for preventing alias artifacts from portions of the subject beyond the roll-off points is to shroud those portions of the subject in an RF shield. Although the RF shield limits the aliasing artifacts, it has several drawbacks. First, the presence of the RF shield affects the performance of the RF coil in a detrimental fashion. Second, access is limited to the shielded region. Further, sometimes the reject region of the subject to be shielded is not amenable to the placement of an RF shield. Placing the RF shield too close to the inserted gradient coil affects the magnetic resonance in the target region within the inserted coil.

The present invention contemplates a new and improved technique for eliminating the aliasing in small gradient coils.

SUMMARY OF THE INVENTION

In accordance with one aspect of the present invention, a method of magnetic resonance imaging utilizing an insertable gradient coil is provided. Material in a region outside of the insertable gradient coil is saturated. After the saturating step, gradients applied by the insertable gradient coil are used for encoding resonating dipoles within the insertable gradient coil. In this manner, aliasing from material in the saturated region outside of the insertable gradient coil is inhibited.

In accordance with one more limited aspect of the present invention, the saturating step is carried out by concurrently applying radio frequency signals from a whole body radio frequency coil and magnetic field gradients from a whole body gradient coil assembly.

In accordance with another aspect of the present invention, a method of magnetic resonance imaging is performed in a magnetic resonance imager which has a magnet assembly for generating a temporally constant magnetic field through a central bore, a whole body gradient coil assembly mounted to the bore, a whole body RF coil assembly mounted to the bore, and an insertable gradient coil assembly which is selectively insertable into the bore. The insertable gradient coil assembly generates linear magnetic field gradients within its bore and roll-off magnetic field gradients in aliasing regions on adjacent exterior ends of the insertable gradient coil assembly. Resonating dipoles in the aliasing regions generate magnetic resonance signals which are encoded the same as resonating dipoles within the bore of the insertable gradient coil assembly. This causes aliasing artifacts in resultant reconstructed magnetic resonance images. The method is characterized by applying a radio frequency excitation pulse and a slice select gradient pulse with the insertable gradient coil assembly concurrently. A magnetic resonance imaging sequence is performed including the application of phase encode and read gradients using the insertable gradient coil assembly. Prior to the magnetic resonance imaging sequence, a magnetic field gradient is applied with the whole body gradient coil to differentiate resonance from dipoles within the insertable gradient coil assembly from dipoles in the aliasing region.

In accordance with another aspect of the present invention, a magnetic resonance imaging apparatus is provided. An insertable gradient coil is insertable into a bore of a main field magnet which generates a temporally constant magnetic field. The insertable gradient coil selectively encodes resonating dipoles disposed therein. A saturating means saturates material in a region of the temporally constant magnetic field outside of the insertable gradient coil. In this manner, aliasing from material in the saturated region outside of the insertable gradient is inhibited.

in accordance with another aspect of the present invention, a magnetic resonance imaging apparatus is provided. A main magnet assembly generates a temporally constant magnetic field generally through a central bore. A whole body gradient coil assembly is mounted in the bore for generating linear magnetic field gradients across and along the central bore. A whole body radio frequency coil assembly is mounted in the central bore for transmitting radio frequency signals into the central bore and for receiving radio frequency signals from resonating nuclei within the central bore. An insertable gradient coil assembly is selectively inserted into the main bore for generating linear magnetic field gradients within its bore. The insertable gradient coil assembly further generates aliasing magnetic fields exterior of itself. A sequence control means selectively causes the whole body radio frequency coil and the whole body gradient coil assembly to saturate the aliasing region outside of the insertable gradient coil assembly.

One advantage of the present invention is that it inhibits roll-over aliasing.

Another advantage of the present invention is that no additional hardware is required. The invention is implemented using hardware already available in conventional magnetic resonance imaging systems.

Another advantage of the present invention is that it provides better spatially defined attenuation of aliasing signals than does the use of RF shielding material. The present invention also does not deresonate the RF coil used for data acquisition as would RF shielding material.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating the preferred embodiments and are not to be construed as limiting the invention.

DETAILED DESCRIPTION OF THE PREFERRED EMBODIMENTS

Figure 1:
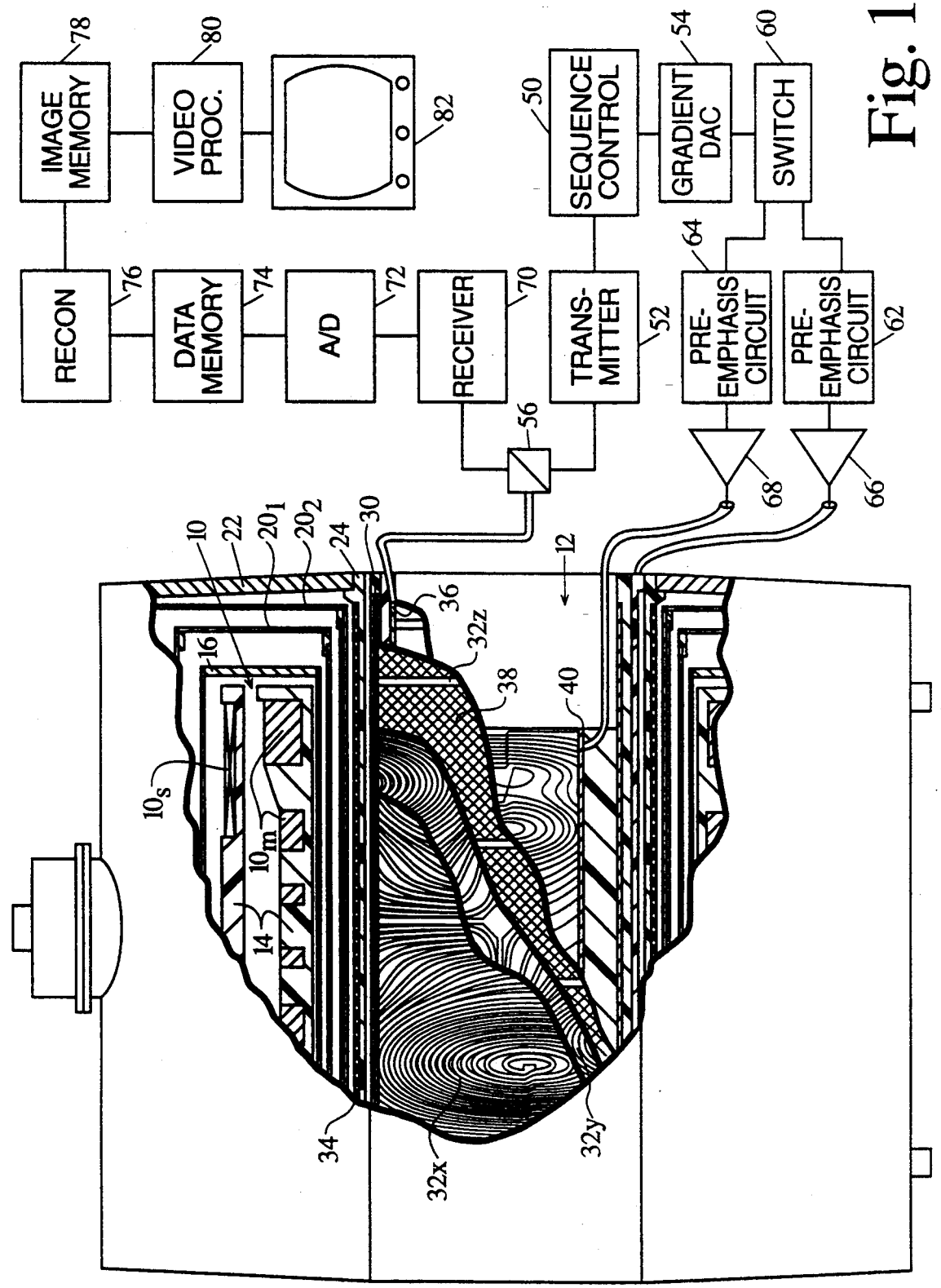
FIG. 1 is a diagrammatic illustration of a magnetic resonance imaging system in accordance with the present invention.

With reference to FIG. 1, a self-shielded superconducting magnetic field coil assembly 10 generates a temporally constant magnetic field along a longitudinal or z-axis of a central bore 12. Windings of a main coil $10_M$ and a shield coil $10_S$ are mounted on a dielectric formers 14 which are received in a toroidal helium vessel or can 16. The helium vessel is filled with liquid helium to maintain the coils at a sufficiently low temperature that the coils remain superconducting in the presence of the imposed magnetic fields.

The toroidal helium vessel 16 is surrounded by a series of cold shields $20_1$, $20_2$, . . . . The cold shields are maintained at progressively colder temperatures toward the helium reservoir. In the preferred embodiment, two cold shields at about 20° K. and 60° K., respectively, are provided. A toroidal, outer vacuum vessel 22 encases the cold shields to define a toroidal vacuum reservoir therearound. Layers of thin mylar insulation are preferably arranged between the vacuum vessel 22 and the cold shields. The vacuum vessel 22 includes a cylindrical bore member 24 through which the temporally constant magnetic field is generated.

A circularly cylindrical, whole body gradient coil assembly 30 is mounted to the cylindrical member 24 of the vacuum vessel. Preferably, the gradient coil assembly is a self-shielded whole body gradient coil assembly which includes primary gradient coils $32_x$, $32_y$, and $32_z$ mounted within the bore 12 and corresponding x, y, and z-gradient shield coils 34 mounted within the vacuum dewar 22. A circularly cylindrical whole body RF coil assembly 36 is supported in the bore 12 by the whole body gradient coil assembly and the cylindrical bore member 24 of the vacuum vessel. An RF shield 38 is disposed between the whole body RF coil and the whole body gradient coil assembly.

An insertable gradient coil assembly 40 is selectively inserted into and removable from the bore 12 for creating gradient magnetic fields in limited regions. In the illustrated embodiment, the insertable gradient coil assembly is a head gradient coil in which the linear region is offset from a geometric center along a longitudinal or z-axis as illustrated in parent U.S. patent application Ser. No. 08/030,601. Other insertable gradient coils include biplanar gradient coils, spine coils, and other insertable gradient coils including those designed for specific regions of the subject.

A sequence control means 50 controls a transmitter 52, preferably a digital transmitter, and a gradient coil digital to analog converter means 54. The transmitter 52 under control from the sequence control means 50 causes magnetic resonance excitation and manipulation pulses to be supplied through a quadrature combiner/divider 56 to the whole body RF coil 36. The gradient digital-to-analog converter means 54 converts digital gradient control signals from the sequence control means 50 into analog current pulses for the x, y, and z-gradient coils. A switching means 60 controlled by the sequence control means 50 selectively switches the analog gradient output between a pre-emphasis circuit 62 for the whole body gradient coil assembly 30 and a pre-emphasis circuit 64 for the insertable gradient coil assembly Gradient amplifiers 66 and 68 amplify the analog current outputs of the whole body pre-emphasis circuit 62 and the insertable gradient coil pre-emphasis circuit respectively. For simplicity of illustration, only a single gradient circuit is illustrated for each gradient coil. It is to be appreciated that analogous circuits are provided for each gradient coil, including the x, y, and z gradient coils for each of the whole body gradient coil, the shield gradient coil, and the insertable gradient coil.

Magnetic resonance signals emanating from the examination region are conveyed from the whole body RF coil 36 to the quadrature combiner/divider 56 to a digital receiver 70. The receiver means demodulates received magnetic resonance signals which are converted by analog-to-digital converters and other interface circuitry 72 into digital magnetic resonance signals. The digital magnetic resonance signals are stored in a data memory 74. A reconstruction means 76, such as an inverse two-dimensional Fourier transform means, reconstructs the data from the data memory 74 into digital image representations which are stored in an image memory 78. A video processor 80 converts selected image representations from the image memory 78 into appropriate format for display on a video monitor 82.

Figure 2:
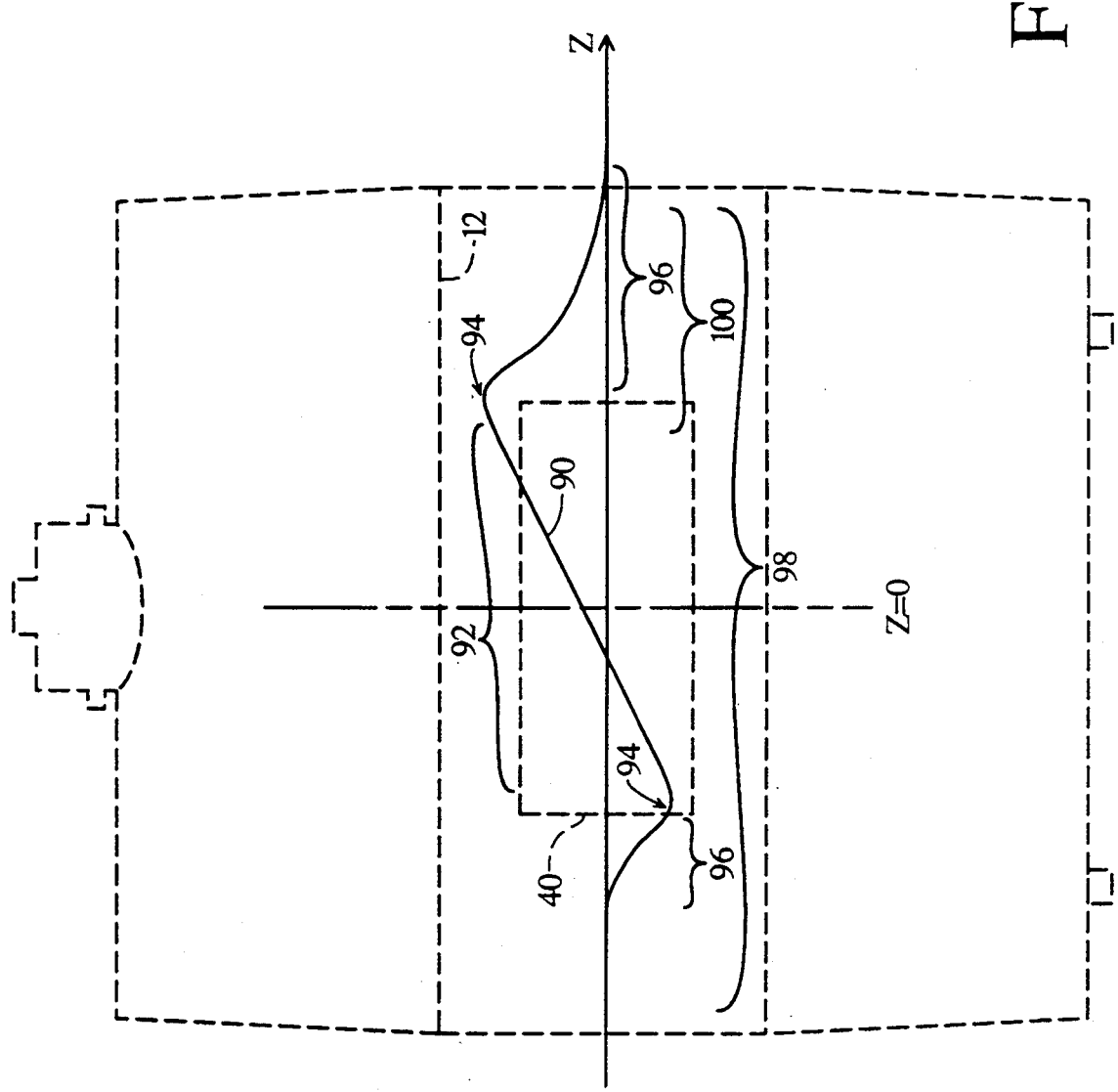
FIG. 2 is a graphical depiction of magnetic field strength versus longitudinal position along the z-axis for the magnetic resonance imaging system of FIG. 1.

With reference to FIG. 2, the insertable gradient coil 40 produces a gradient magnetic field 90 which is linear over a target region 92 within the insertable gradient coil between end edges of the insertable coil. The gradient reaches maxima at roll-over points 94. Thereafter, the gradient decays back towards zero with physical displacement along the z-axis within aliasing regions 96. The whole body radio frequency coil 36, being larger than the insertable gradient coil 40, is sensitive to a larger region 98 between end edges of the bore 12. This larger region 98 to which the radio frequency coil is sensitive includes the gradient field in the aliasing regions 96 beyond the roll-over points 94. In accordance with the present invention, a gradient coil other than the insertable gradient coil, the whole body gradient coil in the illustrated embodiment, is used in conjunction with the radio frequency transmitter 52 to saturate or otherwise identify the signals from all or selected portions of the aliasing region 96. Saturation is caused in regions (1) to which the RF coil assembly 36 is sensitive, (2) beyond the roll-off points in which there is a magnetic field gradient, and (3) within which there is a portion of the subject. In the illustrated embodiment in which the inserted coil is a head coil, only region 100 in which the torso of the patient is disposed need be saturated. Error in the portion of the aliasing region 96 where there is no subject provides no significant aliasing. Of course, instead of using the main gradient coil 30, other additional gradient coils may be utilized to provide the presaturation. For example, in the above-described head coil embodiment, a second insertable coil, such as the biplanar gradient coil illustrated in U.S. Pat. No. 5,036,282 can be used to saturate the neck and any regions of the torso which fall in the aliasing region 100.

Figure 3:
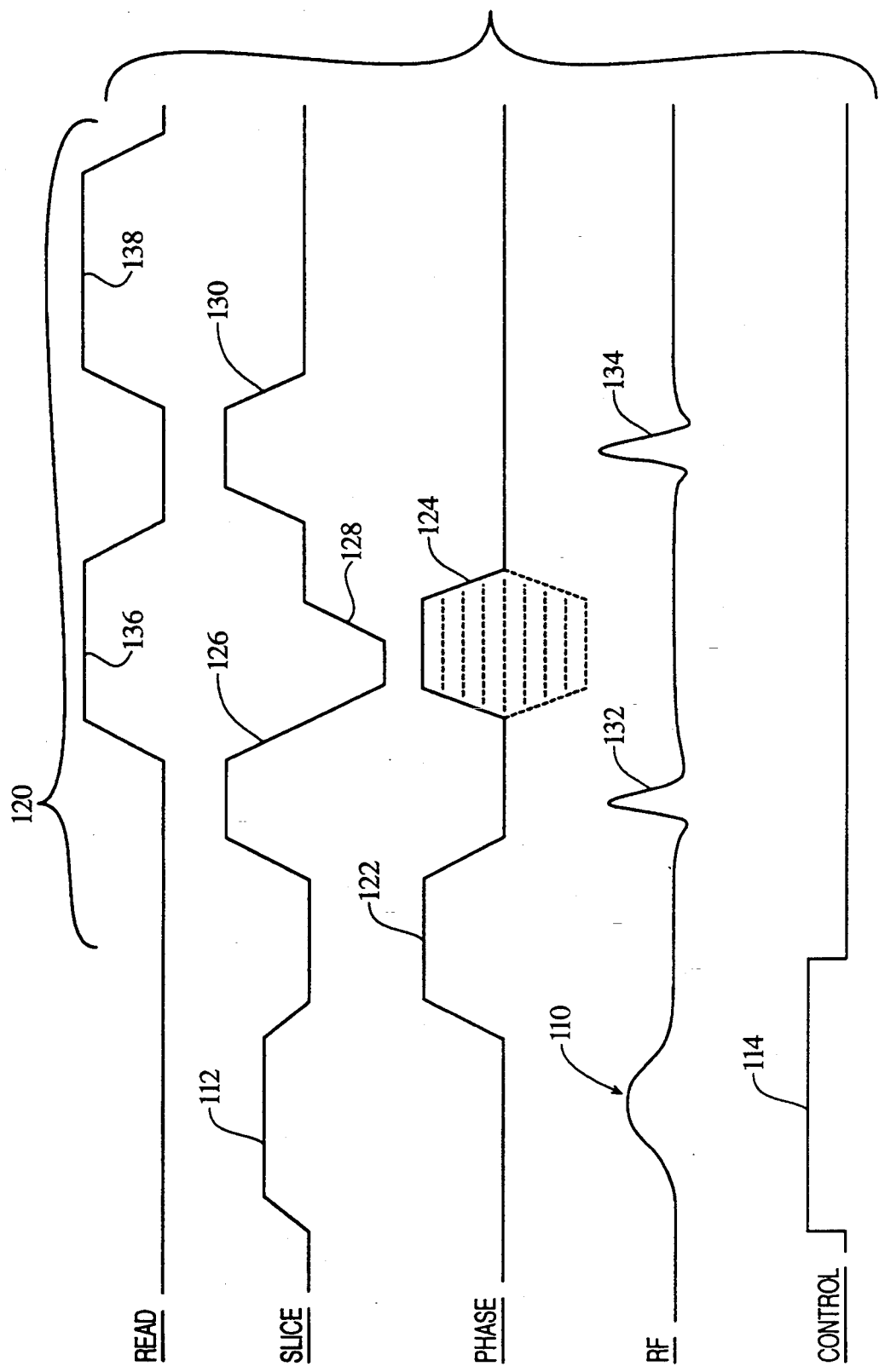
FIG. 3 illustrates a gradient and RF sequence in accordance with the present invention; and, FIG. 4 is a diagrammatic illustration of an alternate embodiment of the system of FIG. 1.

With reference to FIG. 3, the sequence control means 50 causes the RF transmitter 52 and whole body radio frequency coil 36 to transmit an RF pulse 100 concurrently with a slice select gradient pulse 112 from the insertable gradient coil assembly 40 and a saturation region selecting gradient pulse(s) 114 emitted by the whole body gradient coil assembly 30 for causing the RF pulse 110 to saturate at least the aliasing region 100. The RF pulse 110 is a tailored pulse which interacts with the slice select pulse such that resonance is excited in the selected slice within the insertable gradient coil and tailored relative to the saturation gradient pulse such that the region 100 is saturated.

Thereafter, a conventional magnetic resonance imaging sequence 120 is applied in which phase encode gradients 122, 124 are applied by the insertable gradient coil assembly 40 along one axis, slice select gradient pulses 126, 128, 130 are applied in coordination with radio frequency inversion pulses 132, 134, and read gradients 136, 138. The slice, phase encode, and read gradients are applied along mutually orthogonal axes by the insertable gradient coil assembly 40.

The saturation pulse is repeated as often as is necessary to eliminate significant signal from the aliasing region. In some sequences, the saturation pulse is applied once per repetition and in others, every several repetitions. For some echo planar imaging experiments, one application may be sufficient. Once saturation is achieved, significantly less RF signal is required to drive the aliasing region back to saturation. Thus, an initial large and dedicated saturation and whole body coil gradient pulse sequence might be applied initially with smaller presaturation pulses applied every one or more repetitions of the cycle to drive the aliasing region back to saturation.

Figure 4:
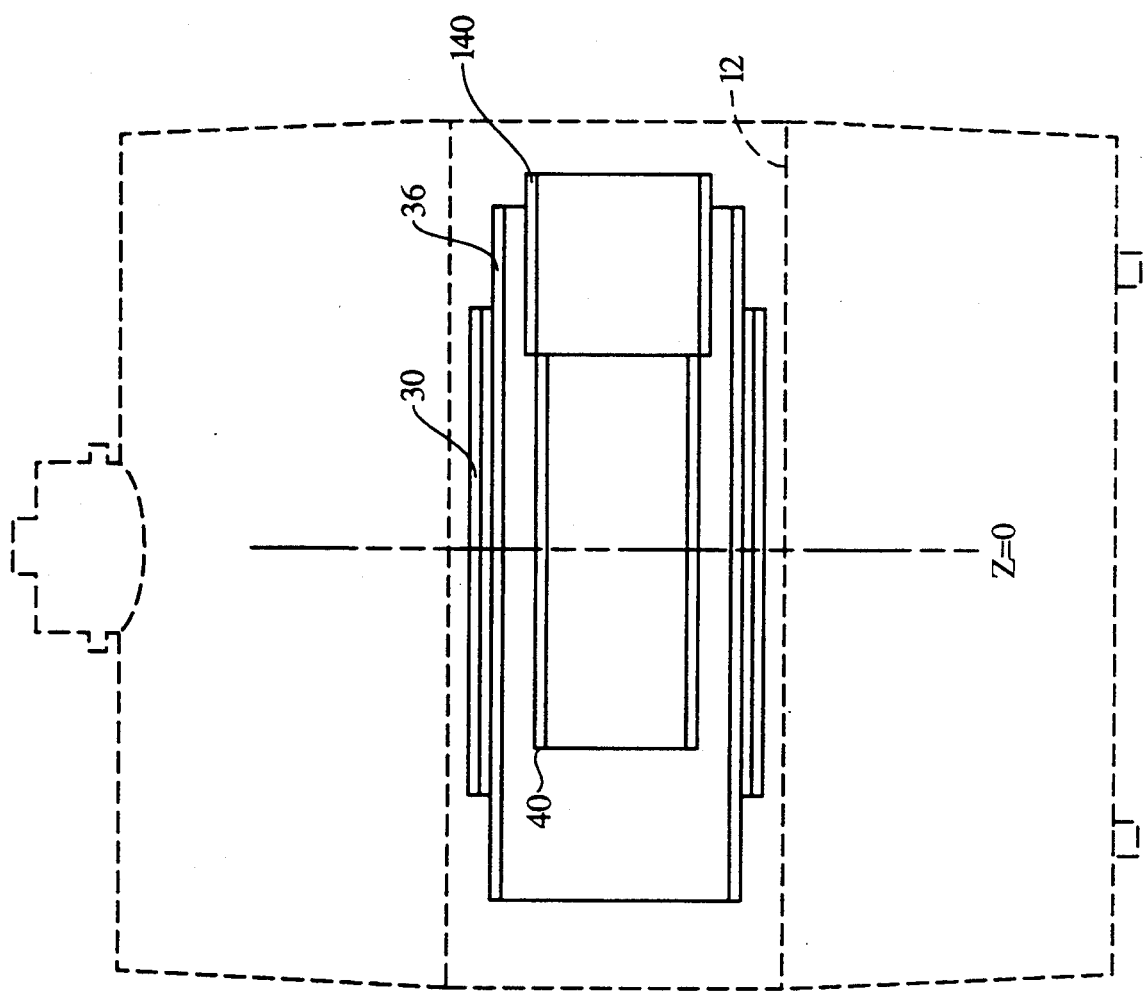

With reference to FIG. 4, rather than using the whole body gradient coil assembly 30 and the whole body RF coil 36 for saturation, presaturation can be provided with a spatially localized radio frequency coil 140 with a field of view limited to the aliasing region 100. The dedicated RF saturation coil 140 may be provided as an integral part or detachable extension of the insertable gradient coil assembly 40.

In the preferred embodiment in which the RF pulse for presaturation comes from the whole body RF coil applied in the presence of gradients from the whole body gradient coil assembly, the field may be badly distorted by the presence of the insertable gradient coil assembly 40. To compensate for this overcompensation, the whole body RF coil may be overdriven and used in conjunction with the insertable gradient coil. The sensitivity of the RF coil would, in general, be low to the aliasing region 100. However, the material in the aliasing region 100 can still be presaturated when the RF coil is driven at a sufficiently large amplitude. The auxiliary RF coil 130 with its sensitivity mainly in the aliasing region, can also be used in conjunction with the whole body gradient coil assembly 30.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A method of magnetic resonance imaging utilizing a magnetic resonance imager having a magnet assembly for generating a temporally constant magnetic field through a central bore., a whole body gradient coil assembly mounted to the bore for causing gradient magnetic fields in the bore, a whole body RF coil assembly mounted to the bore for causing dipoles in the bore to resonate and for receiving resonance signals from resonating dipoles in the bore, and an insertable gradient coil which is selectively insertable into the bore for specific procedures and removable from the bore, the method comprising:

resonating dipoles that are disposed in the bore inside and outside of the insertable gradient coil;

saturating magnetic resonance of the resonating dipoles which are disposed outside of the insertable gradient coil;

after saturating the resonating dipoles outside of the inserted gradient coil, using gradients applied by the insertable gradient coil for encoding the resonating dipoles disposed inside the insertable gradient coil, whereby aliasing from resonating dipoles in the saturated region outside of the insertable gradient coil is inhibited.

2. The method as set forth in claim 1 wherein the saturating step includes:

concurrently applying radio frequency signals with the whole body radio frequency coil and magnetic field gradients with the whole body gradient coil assembly.

3. The method as set forth in claim 1 wherein the saturating step includes applying RF signals with an RF coil whose sensitivity is limited spatially to the region outside of the insertable gradient coil.

4. A method of magnetic resonance imaging using a magnetic resonance imager having a magnet assembly for generating a temporally constant magnetic field through a central bore, a whole body gradient coil assembly mounted to the bore, a whole body RF coil assembly mounted to the bore, and an insertable gradient coil assembly which is selectively insertable into the bore for specific procedures and removable from the bore, which insertable gradient coil assembly generates linear magnetic field gradients within its bore and roll-off magnetic field gradients in aliasing regions on adjacent exterior ends of the insertable gradient coil assembly, resonating dipoles in the aliasing regions generating magnetic resonance signals which are encoded the same as resonating dipoles within the bore of the insertable gradient coil assembly causing aliasing artifacts in resultant reconstructed magnetic resonance images, the method comprising:

applying a radio frequency excitation pulse and a slice select gradient pulse with the insertable gradient coil assembly concurrently;

performing a magnetic resonance imaging sequence including the application of phase encode and read gradients using the insertable gradient coil assembly to encode phase and frequency in resonating dipoles within the insertable gradient coil assembly;

prior to the magnetic resonance imaging sequence, applying a magnetic field gradient with the whole body gradient coil to differentiate resonance from dipoles within the insertable gradient coil assembly from dipoles in the aliasing region.

5. The method as set forth in claim 4 further including:

concurrently with application of the gradient pulse from the whole body gradient coil assembly, applying RF energy to saturate dipoles in the aliasing region.

6. The method as set forth in claim 4 further including:

applying the magnetic field gradient with the whole body gradient coil concurrently with applying the radio frequency excitation pulse and the slice select gradient pulse with the insertable gradient coil.

7. A magnetic resonance imaging apparatus comprising:

a magnet assembly for generating a temporally constant magnetic field gradient through a central bore thereof;

a whole body gradient coil assembly mounted in the central bore for generating linear magnetic field gradients across and along the central bore;

a whole body radio frequency coil assembly mounted in the central bore for transmitting radio frequency signals into the central bore and receiving radio frequency signals from resonating nuclei within the central bore;

an insertable gradient coil assembly selectively insertable into the main bore for generating linear magnetic field gradients within a bore of the insertable gradient coil assembly, which insertable gradient coil assembly further generates aliasing magnetic field gradients exterior thereof;

a sequence control means for selectively causing the whole body radio frequency coil and the whole body gradient coil assembly to saturate the aliasing region outside of the insertable gradient coil assembly.

8. The apparatus as set forth in claim 7 further including:

a gradient digital-to-analog converter means for converting digital gradient control signals to analog signals;

a switching means for switching the analog signals to one of a whole body pre-emphasis circuit and an insertable gradient coil pre-emphasis circuit;

a whole body gradient amplifier means for amplifying analog signals from the whole body pre-emphasis circuit and applying the amplified signals to the whole body gradient coil assembly; and an insertable gradient coil gradient amplifier means for amplifying analog signals from the insertable gradient coil pre-emphasis circuit and applying the amplified signals to the insertable gradient coil assembly.

9. A magnetic resonance imaging apparatus comprising:

a means for generating a temporally constant magnetic field which selectively aligns dipoles disposed therein;

a means for exciting magnetic resonance in the dipoles aligned with the temporally constant magnetic field;

an insertable gradient coil which is insertable in the temporally constant magnetic field for encoding a portion of the resonating dipoles which are disposed within the insertable gradient coil;

a saturating means for saturating resonating dipoles in a region of the temporally constant magnetic field outside of the insertable gradient coil, whereby aliasing from resonating dipoles in the saturated region outside of the insertable gradient coil is inhibited.

10. The apparatus as set forth in claim 9 wherein the saturating means includes:
- a whole body gradient coil assembly which surrounds the resonating dipoles; and
- a whole body radio frequency coil assembly mounted to transmit radio frequency signals to the resonating dipoles and to receive resonance signals from the resonating dipoles.

11. The method as set forth in claim 9 wherein the saturating means includes:
- an RF coil whose sensitivity is limited spatially to the region of resonating dipoles outside of the insertable gradient coil.

* * * * *